United States Patent [19]

Dawdy

[11] 4,389,640

[45] Jun. 21, 1983

[54] APPARATUS FOR DETECTING LOSS OF AC POWER SUPPLY AND LOSS OF CURRENT

[75] Inventor: James E. Dawdy, Cambridge, Canada

[73] Assignee: Sutherland-Schultz Limited, Kitchener, Canada

[21] Appl. No.: 249,537

[22] Filed: Mar. 31, 1981

[30] Foreign Application Priority Data

Dec. 8, 1980 [CA] Canada .................................. 366341

[51] Int. Cl.³ ............................................ G08B 23/00
[52] U.S. Cl. .................................... 340/664; 340/640; 340/650; 340/660
[58] Field of Search ................ 340/640, 654, 655, 660, 340/664, 663, 650, 652; 361/65, 66, 30; 364/483; 324/133

[56] References Cited

U.S. PATENT DOCUMENTS

| | | | |
|---|---|---|---|
| 3,564,528 | 2/1971 | Drushel | 340/664 |
| 3,778,801 | 12/1973 | Nudelmont | 340/660 |
| 4,099,068 | 7/1978 | Kobayashi et al. | 340/654 |
| 4,300,182 | 11/1981 | Schweitzer | 361/65 |

*Primary Examiner*—Gerald L. Brigance

*Attorney, Agent, or Firm*—Robert F. Delbridge; Arne I. Fors

[57] ABSTRACT

Apparatus for detecting loss of AC power supply for an electrical conductor and loss of current through the electrical conductor when the power supply is connected thereto comprises voltage responsive means operable to produce a voltage present signal when the power supply is connected to the electrical conductor and a predetermined voltage is present across the conductor and a voltage absent signal when the predetermined voltage is not present across the conductor, and current responsive means operable to produce a current present signal when a predetermined current is flowing through the conductor and a current absent signal when the predetermined current is not flowing through the conductor. Fault-signalling means is connected to the AC power supply for operation thereby, and means responsive to the simultaneous presence of a voltage present signal and a current present signal and to the simultaneous presence of a voltage absent signal and a current absent signal causes the power supply to operate the fault-signalling means in a no-fault indicating sense. The absence of the AC power supply or the simultaneous presence of an absent signal and a present signal causes the fault-signalling means to indicate a fault condition.

10 Claims, 1 Drawing Figure

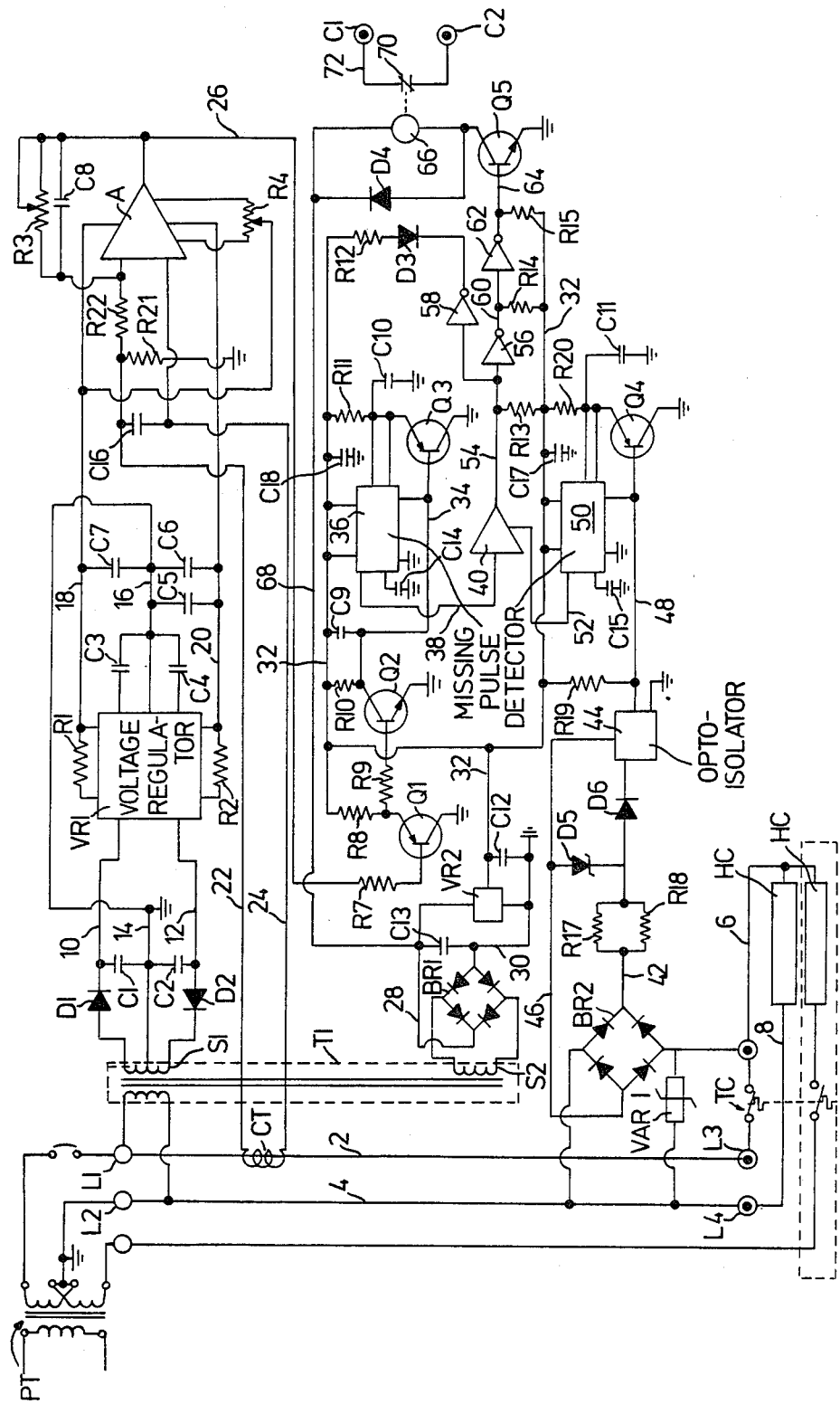

APPARATUS FOR DETECTING LOSS OF AC POWER SUPPLY AND LOSS OF CURRENT

This invention relates to apparatus for detecting loss of AC power supply for an electrical conductor and loss of current through the electrical conductor when the power supply is connected thereto.

There are situations where electrical current is only required to pass through an electrical conductor from time to time, for example where the electrical conductor is a heating element used for heating some object, the arrangement also including a thermostat which causes current to flow through the conductor when the temperature of the object falls below a predetermined value. One example of such an arrangement would be where fluid flowing through a pipe has to be maintained at a temperature above a predetermined value, and the electrical conductor is a heating coil associated with the pipe.

In industrial applications, it is desirable to monitor the heating circuit to ensure that heating is in fact taking place when required. Some installations of this kind are in remote locations, and hence an automatic monitoring system is necessary. Since electric current is only required to flow through the conductor when called for by the thermostat, it is desirable not only to know that current is flowing through the thermostat when called for, but also to know that power supply to the thermostat is available so that current will flow through the conductor when required by the thermostat.

It is therefore an object of the invention to provide suitable monitoring apparatus for this purpose.

According to the present invention, monitoring apparatus comprises voltage responsive means operable to produce a voltage present signal when an AC power supply is connected to an electrical conductor and a predetermined voltage is present across the conductor, and a voltage absent signal when the predetermined voltage is not present across the conductor. Current responsive means is operable to produce a current present signal when a predetermined current is flowing through the conductor and a current absent signal when the predetermined current is not flowing therethrough. Fault-signalling means is connected to said AC power supply for operation thereby, and means responsive to the simultaneous presence of a voltage present signal and a current present signal and the simultaneous presence of a voltage absent signal and a current absent signal causes the power supply to operate the fault signalling means in a no-fault indicating sense. The absence of the AC power supply or the simultaneous presence of an absent signal and a present signal causes the fault signalling means to indicate a fault condition.

The fault-signalling means may comprise a visual device which is operated in one manner by current from the AC power supply in the no-fault condition and through which no current flows in the fault condition to thereby indicate a fault.

Alternatively or additionally, fault-signalling means may comprise a relay coil through which current flows from the AC power supply in the no-fault condition and through which no current flows in a fault condition, and the apparatus also includes alarm means operable by an electrical power source independent of said AC power supply, the alarm means including a relay contact opened by the relay coil when current flowing therethrough, said relay contact being closed when no current flows through the relay coil to cause operation of said alarm means.

The voltage responsive means may include means to produce pulses when said predetermined voltage is present across the electrical conductor and a missing pulse detector operable to produce said voltage present signal when said pulses are present and to produce said voltage absent signal when said pulses are not present. The missing pulse detector may be coupled to the pulse producing means by opto-coupling means.

The current responsive means may include means to produce and transmit pulses only when said predetermined current is flowing through the conductor and a missing pulse detector operable to receive transmitted pulses and produce said current present signal when said pulses are present and to produce said current absent signal when said pulses are not present.

The current responsive means may include means operable to produce pulses whose amplitude is indicative of the value of the current in the conductor and means to transmit to the missing pulse detector only those pulses indicative of current of at least the predetermined value in the conductor.

The pulse producing means may pass only negative pulses to the pulse transmitting means. The pulse producing means may be adjustable to vary the value of the predetermined current which produces a current present signal.

The pulse producing means may comprise a first variable amplification stage and a second stage which passes only negative pulses to the pulse transmitting means.

One embodiment of the invention will now be described, by way of example, with reference to the accompanying drawing which shows an electrical circuit diagram of monitoring apparatus for a heating cable installation.

Referring to the drawing, monitoring apparatus has power lines 2, 4 connected between terminals L1 and L3 and L2 and L4 respectively. Terminals L1 and L2 are connected to a 120 volt AC power supply transformer PT. Terminal L3 is connected through thermostat contact TC and line 6 to an electrical heating cable HC, and terminal L4 is connected to the heating cable HC through line 8.

The monitoring apparatus includes a transformer T1 with a primary connected across power lines 2, 4. Transformer T1 also has a center-tapped 28 volt secondary S1 connected to a voltage regulator VR1 which regulates output voltage at ±15 volts. Opposite ends of the 28 volt secondary S1 are connected through respective diodes D1, D2 and lines 10, 12 to respective terminals of the voltage regulator VR1, and the centre tap of secondary S1 is connected to grounded line 14. A capacitor C1 is connected between line 10 and ground line 14, and a capacitor C2 is similarly connected between line 12 and ground line 14. The diodes D1, D2 and capacitors C1, C2 and the centre tap thus provide positive and negative voltage for the regulator VR1.

The output side of voltage regulator VR1 has a grounded line 16 which is connected to a terminal of the regulator VR1 and is also connected to further terminals through capacitors C3, C4 as indicated in the drawing. The capacitors C3, C4 provide positive and negative compensation stability. Regulator VR1 has output lines 18, 20 connected to respective terminals of an operational amplifier A, with a capacitor C5 being connected between output line 20 and ground line 14 to increase the stability of the regulator at low temperatures. The capacitors C6, C7 are connected between output lines 18, 20 respectively and ground line 16 to provide transient response and reduce noise on the output voltages of the regulator VR1. Resistors R1, R2 are connected between output lines 18, 20 and respective terminals of the regulator VR1 to provide voltage feed back for the voltage sensing portions of the regulator. A variable resistor R4 is connected across individual terminals of amplifier A with a sliding contact being connected to regulator output line 18 to provide an offset null adjustment for the amplifier.

A current sensing 10 turn toroid CT around power line 2 is connected by lines 22, 24 to amplifier A, with capacitor C16 being connected across lines 22, 24 and with resistor R21 being connected between line 22 and ground. Thus, the current sensed by toroid CT develops a voltage across resistor R21 which is applied to amplifier A. A resistor R22 is connected in line 22 between resistor R21 and amplifier A. Capacitor C16 is a spike filter to eliminate spurious induced current spikes common to AC power lines.

Amplifier A has an output line 26 which is connected through variable resistor R3 and a capacitor C8 in parallel to line 22 between resistor R22 and amplifier A. Resistors R3 and R22 provide the amplifier gain ratio, and capacitor C8 is a band pass filter.

Amplifier A provides first stage amplification for the current signal, the output signal from amplifier A being an alternating voltage swinging between positive and negative voltage values, the pulse amplitude varying in accordance with the current in power line 2, and with the gain ratio determined by the setting of resistor R3.

Transformer T1 also has a 6.3 volt secondary S2 connected to bridge rectifier BR1 with output lines 28, 30 connected to a voltage regulator VR2 set at +5 volts with line 30 being grounded. A capacitor C13 is connected between output line 28, 30 to smooth out the output waveform of rectifier BR1 and to provide a smooth source of DC to the regulator VR2. Regulator VR2 has an output line 32 with a capacitor C12 being connected between line 32 and ground to provide transient response and reduce noise on the output of regulator VR2.

Amplifier output line 26 is connected through resistor R7 to the base of transistor Q1 whose collector is grounded. The emitter of transistor Q1 is connected through resistor R8 to 5 volt output line 32. Transistor Q1 and resistors R7, R8 form a second stage amplification for the current signal, with resistor R7 being a base bias resistor for transistor Q1. In the second amplification state, only the negative portion of the signal from amplifier A is amplified, it having been found that this signal is more stable.

The emitter of transistor Q1 is connected through resistor R9 to the base of transistor Q2 whose emitter is grounded and whose collector is connected through resistor R10 and a capacitor C9 in parallel to the 5 volt line 32. Transistor Q2, resistors R9, R10 and capacitor C9 provide a third stage of amplification for the current signal in which the output signal from the second amplification stage, if of sufficient amplitude, is amplified into square wave pulses of 5 volt amplitude. The wave pulses are transmitted through line 34 to a missing pulse detector 36. No square wave pulses will be produced in this third stage if the negative pulses of the second stage are of insufficient amplitude, that is to say do not provide sufficient bias voltage on the base of transistor Q2.

The missing pulse detector 36 is an adjustable time base device whose output is fed through line 38 to a tri-state buffer gate 40 as will be described in more detail later. Line 34 from transistor Q2 is also connected to the base of transistor Q3 whose collector is grounded and whose emitter is connected to the missing pulse detector 36 and through resistor R11 to 5 volt line 32. The emitter is also connected to grounded capacitor C10. Transistor Q3, resistor R11 and capacitor C10 determine the time base of the missing pulse detector 36. The capacitor C18 is connected between 5 volt line 32 and ground, and capacitor C14 is connected between the missing pulse detector 36 and ground to provide power stability for the missing pulse detector 36, which has other connections to the 5 volt line 32 as shown.

The output of the missing pulse detector 36 on line 38 is at 5 volts whenever pulses are fed to the missing pulse detector 36 from transistor Q2 through line 34 at a rate greater than the time base determined by the transistor Q3, the resistor R11 and capacitor C10. If the interval between pulses is greater than the time base, the output on line 38 goes to zero volts.

The monitoring circuit so far described has been concerned with sensing current in power line 2. The part of the circuit concerned with sensing power supply voltage when thermostat contact TC is closed will now be described. Closure of thermostat contact TC energizes a bridge rectifier BR2 connected across power lines 2 and 6. The connection of bridge BR2 to line 4 includes a varistor VAR1 which provides transient suppression by clipping induced voltage spikes in lines 2, 4. Bridge rectifier BR2 has output lines 42, 46, with output line 42 being connected through resistors R17, R18 in parallel and through diode D6 to an opto-isolator 44. Rectifier output line 46 is connected to opto-isolator 44, with a zener diode D5 being connected between lines 36 and 42, the connection of diode D5 with line 42 being between resistors R17, R18 and diode D6. Resistors R17, R18 are voltage-dropping resistors, and zener diode D5 suppresses the voltage to 5.1 volts. Diode D6 provides additional blocking and voltage drop for the opto-isolator 44. Opto-isolator 44 provides noise immunity and comprises a light-emitting diode coupled to a photo-transistor to eliminate any direct connection of the AC wiring with the remainder of the monitoring circuit.

Opto-isolator 44 is grounded as shown and has an output line 48 connected through bias resistor R19 to 5 volt line 32. Output line 48 is also connected to a second missing pulse detector 50. Thus, closure of thermostat contact TC causes the opto-isolator 44 to provide an alternating waveform between 0 and 5 volts to be fed to the missing pulse detector 50.

The missing pulse detector 50 is an adjustable time base device whose output is fed through line 52 to gate 40. Line 48 from opto-isolator 44 is also connected to the base of transistor Q4 whose collector is grounded and whose emitter is connected to the missing pulse detector 50 and through resistor R20 to 5 volt line 32. The emitter of transmitter Q4 is also connected to grounded capacitor C11. Transistor Q4, resistor R20 and capacitor C7 determine the time base of the missing pulse detector 50. The capacitor C17 connected between 5 volt line 32 and ground and the capacitor C15 connected between the missing pulse detector 50 and ground provide power stability for the missing pulse detector 50 which has other connections to 5 volt line 32 and ground as shown. The output of missing pulse detector 50 on line 52 is at 5 volts whenever the pulses are fed to the missing pulse detector 50 at a rate greater than the time base determined by transistor Q4, resistor R20 and capacitor C11. If the interval between pulses is greater than the time base, the output on line 38 goes to zero volts.

As previously mentioned, the current sensing signal on line 38 and the voltage sensing signal on line 52 are received by gate 40. If the signals are both the same, i.e. both 5 volts or both zero volts, then the gate output is high, namely 5 volts. If the signals are different, i.e. if one signal is 5 volts and the other signal is zero volts, then the gate output is low, i.e. zero volts. The output of gate 40 is connected through line 54 to inverter gates 56, 58, with a voltage pull-up resistor R13 being connected between line 54 and 5 volts line 32. Gates 56, 58 reverse the signal supplied to their inputs, that is to say a 5 volt signal at the input produces a zero volt signal at the output and vice-versa.

A light emitting diode D3 is connected through resistor R12 to 5 volt line 32 and to the output of gate 58. The output of gate 56 is connected through line 60 to the input of gate 62, with a voltage pull-up resistor R14 being connected between line 60 and 5 volt line 32. Gate 62 is also an inverter gase and its output is connected through line 64 to the base of transistor Q5 with a voltage pull-up resistor R15 being connected between line 64 and 5 volt line 32. The emitter of transistor Q5 is grounded, and the collector is connected to a relay coil 66 which is also connected through line 68 to output line 28 of bridge rectifier BR1. A diode D4 connected across relay coil 66 provides counter EMF blocking, thereby absorbing induced voltage, when the relay coil 66 is de-energized, as will be described in more detail later.

Relay coil 66 is associated with relay contact 70 in an independent alarm circuit 72, only a portion of which is shown, the relay circuit 72 have a power source independent of the power supply for the heating cable being monitored.

The operation of the monitoring apparatus will now be described. Assuming first that the power supply to the power transformer PT is functioning correctly and that the thermostat contact TC is open, there will be no current in power line 2, and a current absent signal, i.e. zero volts, will appear on line 38 and be supplied to gate 40. Similarly, there will be no voltage across bridge rectifier BR2, and a voltage absent signal, i.e. zero volts, will appear on line 52 and also be supplied to gate 40. Since both signals to gate 40 are the same, the output of gate 40 will high, i.e. 5 volts, and the outputs of gates 56, 58 will be low, i.e. zero volts. Thus, the output of gate 62 will be high, i.e. 5 volts. The low output of gate 58 will cause current to flow through light emitting diode D3 which then illuminates and provides a visual signal that the circuit is in a no-fault condition. The high output of gate 62 turns on transistor Q5 with the result that relay coil 66 is energized and relay contact 70 is open. The alarm circuit 72 is therefore de-actuated.

When the thermostat senses that the heating element HC should be operated to provide more heat to the item whose temperature is being controlled, the thermostat contact TC closes the circuit between the power transformer PT and the heater coil HC. Heating current then flows through power lines 2, 4, and the current is sensed by toroid CT with the result that pulses are fed to the missing pulse detector 36 at a rate greater than its time base, and a current present signal, i.e. 5 volts, appears on line 38 and is fed to gate 40. Similarly, there will be a voltage across bridge rectifier BR2, with the result that pulses will be fed to missing pulse detector 50 at a rate greater than its time base and a voltage present signal, i.e. 5 volts, will appear in line 52 and be supplied to gate 40. Since both signals to gate 40 are still the same, diode D3 will remain illuminated, and relay coil 66 will remain energized, thereby continuing to de-actuate the alarm circuit 72.

The current through the heating cable HC may become insufficient when the thermostat contact TC is closed, for example because of a break in the cable or for other reasons.

If this happens, the amplitude of the pulses (if any) from the second amplification stage provided by transistor Q1 will be insufficient to be amplified by the third amplification stage provided by transistor Q2, and hence a current absent signal will appear on line 38 and be supplied to gate 40. However, the voltage present signal will still appear on line 52 and be supplied through gate 40. Thus, the signals to gate 40 are now different, with the result that the output of gate 40 goes low, i.e. zero volts. This causes the output of gate 58 to be high, i.e. 5 volts, with the result that no current flows through light emitting diode D3 which is therefore turned off, thereby signalling a fault. At the same time, the output of gate 56 goes high, with the output of gate 62 therefore going low, i.e. zero volts, so that transistor Q5 is turned off. Relay coil 66 thus becomes de-energized, and relay contacts 70 close thereby completing the alarm circuit 72.

If the power supply to the heater coils HC fails, no power will be supplied to transformer T1 and there will be no output voltage at bridge rectifier BR1, with the result that there will be no voltage on the line 32 or line 68. Thus, light-emitting diode D3 will go out, thereby indicating a fault, and relay coil 66 will be de-energized to cause the alarm circuit 72 to be completed by closing of the relay contact 70.

The circuit as so far described, is for the case where the heating coil HC requires 110 volts supply. The drawing also shows the necessary connections for a 240 V heating coil HC'.

The predetermined value of the current in power line 2 which is required to produce a current present signal at gate 40 may be varied by adjusting resistor R3 to vary the gain ratio of operational amplifier A, since it will be recalled that negative pulses below a certain amplitude produced in the second amplifier stage including transistor Q1 will not produce any pulses in the third amplification stage including transistor Q2.

It will also be noted that if unauthorized equipment is connected between terminals L3 and L4, a fault will be indicated if the thermostat is open, since there will be current through the power line 2 (assuming that the current is sufficient to produce pulses in the third stage of amplification).

In a specific example of the invention, the current sensing portion of the circuit was adjustable to enable a loss in current below any preset value in the range of 0.5 to 25 amps in the 110 volt heating coils to be detected, the corresponding range for the 220 volt heating coil HC being 1 to 25 amps. The various actual components in the specific circuit were as follows:

| | |
|---|---|
| D1, D2, D4 | 1N4004 Diodes |
| D6, BR1, BR2 | |

-continued

| | |
|---|---|
| D5 | 1N4733A Zener Diode |
| D3 | L.E.D. High Intensity HP #5082-4655 |
| C1, C2, C16 | 220 μF 25V Electrolytic Cap |
| C3, C4 | 1500 PF Ceramic Disc. Cap |
| C5, C8, C10, C11 | 1 μF Ceramic Disc. Cap |
| C6, C7 | 1 μF Solid Tantalum Cap |
| C12 | 4.7 μF Solid Tantalum Cap |
| C13 | 1000 μF 16V Electrolytic Cap |
| R3 | 100 K ohms 20 Turn Trim Pot |
| R4 | 25 K ohms 20 Turn Trim Pot |
| R17, R18 | 18 K ohms 1W |
| R1, R2 | 4.7 ohms ¼W |
| R7, R8, R20 | 47 K ohms ¼W |
| R10, R14 | 1 K ohms ¼W |
| R11 | 300 K ohms ¼W |
| R12 | 220 ohms ¼W |
| R9, R13 | 2.2 K ohms ¼W |
| R19 | 10 K ohms ¼W |
| VR1 | MC 1568 |
| A | LF 256H |
| VR2 | LM 309K |
| MPD | LM 555 |
| GATES 56, 58, 62 | 7406 1C |
| OPTO-ISOLATOR 44 | 1L74 |
| GATE 40 | DM 8094 1C |
| Q1 | 2N2907 |
| Q2 | MPSA06 |
| Q3, Q4 | MPSA56 |
| Q5 | 2N4124 |
| RELAY 66 | P & B R50-E2-X1-5V |
| T1 | Transformer #8508 |
| VARI | Varistor #V150LAIDA |
| C14, 15, 17, 18 | .01 μF Ceramic Disc |
| R21 | 3.3 ohms ¼W |
| CT | Toroid - 10TURN #31 Magnet Wire |
| R15 | 360 ohms ¼W |
| R22 | 100 ohms ¼W. |

Other embodiments and examples of the invention will be readily apparent to a person skilled in the art, the scope of the invention being defined in the appended claims.

What I claim as new and desire to protect by Letters Patent of the United States is:

1. Apparatus for detecting loss of AC power supply for an electrical conductor and loss of current through the electrical conductor when the power supply is connected thereto, said apparatus comprising voltage responsive means operable to produce a voltage present signal when the power supply is connected to the electrical conductor and a predetermined voltage is present across the conductor and a voltage absent signal when the predetermined voltage is not present across the conductor, current responsive means operable to produce a current present signal when a predetermined current is flowing through the conductor and a current absent signal when the predetermined current is not flowing through the conductor, fault-signalling means connected to said AC power supply for operation thereby, and means responsive to the simultaneous presence of a voltage present signal and a current present signal and to the simultaneous presence of a voltage absent signal and a current absent signal to cause the power supply to operate the fault-signalling means in a no-fault indicating sense, the absence of said AC power supply or the simultaneous presence of an absent signal and a present signal causing the fault-signalling means to indicate a fault condition.

2. Apparatus according to claim 1 wherein the fault-signalling means comprises a visual device which is operated in one manner by current from the AC power supply in the no-fault condition and through which no current flows in the fault condition to thereby indicate a fault.

3. Apparatus according to claim 1 wherein the fault-signalling means comprises a relay coil through which current flows from the AC power supply in the no-fault condition and through which no current flows in a fault condition, and the apparatus also includes alarm means operable by an electrical power source independent of said AC power supply, the alarm means including a relay contact opened by the relay coil when current is flowing therethrough, said relay contact being closed when no current flows through the relay coil to cause operation of said alarm means.

4. Apparatus according to claim 1 wherein said voltage responsive means includes means to produce pulses when said predetermined voltage is present across the electrical conductor and a missing pulse detector operable to produce said voltage present signal when said pulses are present and to produce said voltage absent signal when said pulses are not present.

5. Apparatus according to claim 4 wherein said missing pulse detector is coupled to the pulse producing means by opto-coupling means.

6. Apparatus according to claim 1 wherein said current responsive means includes means to produce and transmit pulses pulses only when said predetermined current is flowing through the conductor and a missing pulse detector operable to receive transmitted pulses and produce said current present signal when said pulses are present and to produce said current absent signal when said pulses are not present.

7. Apparatus according to claim 6 wherein said current responsive means includes means operable to produce pulses whose amplitude is indicative of the value of the current in the conductor and means to transmit to the missing pulse detector only those pulses indicative of current of at least the predetermined value in the conductor.

8. Apparatus according to claim 7 wherein the pulse producing means passes only negative pulses to the pulse transmitting means.

9. Apparatus according to claim 7 wherein said pulse producing means is adjustable to vary the value of the predetermined current which produces a current present signal.

10. Apparatus according to claim 9 wherein said pulse producing means comprises a first variable amplification stage and a second stage which passes only negative pulses to the pulse transmitting means.

* * * * *